United States Patent
Zeng et al.

(10) Patent No.: US 11,289,596 B2
(45) Date of Patent: Mar. 29, 2022

(54) SPLIT GATE POWER DEVICE AND ITS METHOD OF FABRICATION

(71) Applicant: MaxPower Semiconductor Inc., San Jose, CA (US)

(72) Inventors: Jun Zeng, Torrance, CA (US); Kui Pu, Chengdu (CN); Mohamed N. Darwish, Campbell, CA (US); Shih-Tzung Su, Taipei (TW)

(73) Assignee: MaxPower Semiconductor, Inc., San Jose, CA (US)

( * ) Notice: Subject to any disclaimer, the term of this patent is extended or adjusted under 35 U.S.C. 154(b) by 184 days.

(21) Appl. No.: 16/782,996

(22) Filed: Feb. 5, 2020

(65) Prior Publication Data

US 2020/0273987 A1 Aug. 27, 2020

Related U.S. Application Data

(60) Provisional application No. 62/810,072, filed on Feb. 25, 2019.

(51) Int. Cl.
| | |
|---|---|
| *H01L 29/78* | (2006.01) |
| *H01L 29/40* | (2006.01) |
| *H01L 29/66* | (2006.01) |
| *H01L 29/08* | (2006.01) |
| *H01L 29/417* | (2006.01) |

(52) U.S. Cl.
CPC ...... *H01L 29/7813* (2013.01); *H01L 29/0878* (2013.01); *H01L 29/407* (2013.01); *H01L 29/41766* (2013.01); *H01L 29/66734* (2013.01)

(58) Field of Classification Search
None
See application file for complete search history.

(56) References Cited

U.S. PATENT DOCUMENTS

| | | | |
|---|---|---|---|
| 6,621,121 B2 | 9/2003 | Baliga | |
| 7,060,562 B2 | 6/2006 | Henninger et al. | |
| 7,098,500 B2 | 8/2006 | Zeng | |
| 8,889,511 B2 | 11/2014 | Yedinak et al. | |
| 9,093,522 B1 | 7/2015 | Zeng et al. | |
| 9,525,058 B2 | 12/2016 | Wutte | |
| 10,319,850 B2* | 6/2019 | Shimomura | ........ H01L 29/4933 |
| 2017/0222038 A1* | 8/2017 | Katou | ............... H01L 29/42376 |

OTHER PUBLICATIONS

PCT/US2020/017042, "International Search Report and Written Opinion," dated May 7, 2020, 9 pages.

* cited by examiner

*Primary Examiner* — Robert K Carpenter
(74) *Attorney, Agent, or Firm* — Brian Ogonowsky; Patent Law Group

(57) ABSTRACT

A split gate power device is disclosed having a trench containing a U-shaped gate that, when biased above a threshold voltage, creates a conductive channel in a p-well. Below the gate is a field plate in the trench, coupled to the source electrode, for spreading the electric field along the trench to improve the breakdown voltage. The top gate poly is initially formed relatively thin so that it can be patterned using non-CMP techniques, such as dry etching or wet etching. As such, the power device can be fabricated in conventional fabs not having CMP capability. In one embodiment, the thin gate has vertical and lateral portions that create conductive vertical and lateral channels in a p-well. In another embodiment, the thin gate has only vertical portions along the trench sidewalls for minimizing surface area and gate capacitance.

19 Claims, 17 Drawing Sheets

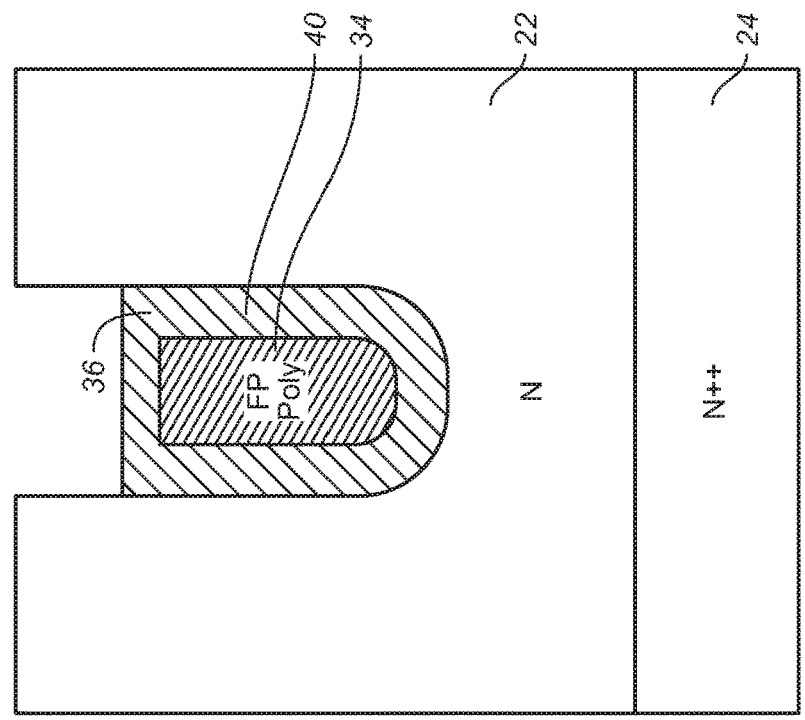
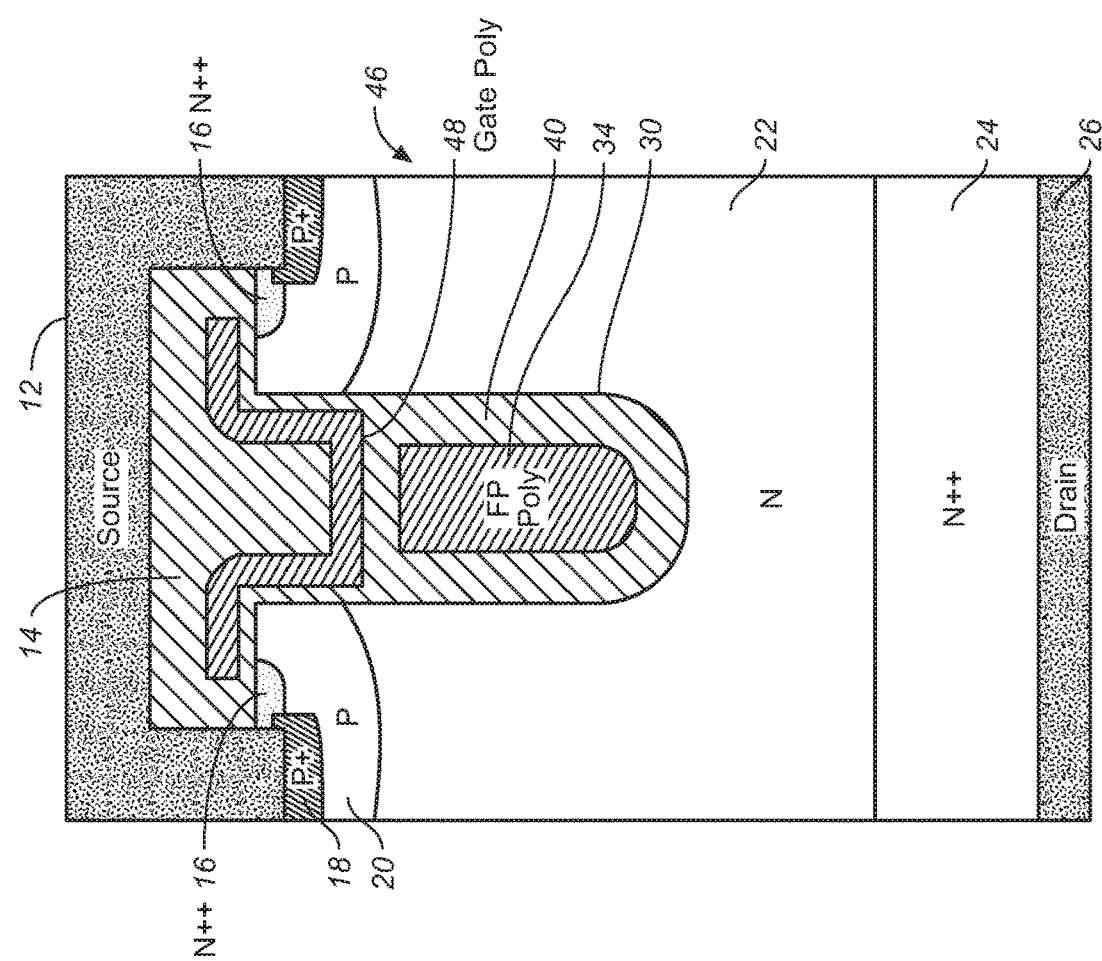

SPLIT GATE POWER DEVICE AND ITS METHOD OF FABRICATION

CROSS REFERENCE TO RELATED APPLICATIONS

This application claims priority from U.S. provisional application Ser. No. 62/810,072, filed Feb. 25, 2019, by Jun Zeng et al., incorporated herein by reference.

FIELD OF INVENTION

The present invention relates to a trench power semiconductor device, such as a MOSFET or an IGBT, and more particularly, to a split-gate MOSFET, or a split gate MOSFET as part of an IGBT or other power device.

BACKGROUND

FIG. 1 is a cross-sectional view of a typical prior art split-gate MOSFET 10. A split-gate MOSFET is also referred to as a shielded-gate MOSFET.

The MOSFET 10 has a metal source electrode 12 insulated by an oxide layer 14. The source electrode 12 contacts an n+ source region 16 and a p+ contact region 18. A p-well region 20 forms a vertical channel between the n+ source region 16 and an n− drift region 22. The n− drift region 22 is formed over an n++ substrate 24 (drain). A metal drain electrode 26 contacts the bottom of the substrate 24.

A gate 28 (doped polysilicon) is formed in a trench 30 and is insulated from the p-well 20 by a thin gate oxide 32. A conductive (doped polysilicon) field plate 34 is formed below the gate 28 and is insulated from the gate 28 by a field oxide 36. A relatively thick field oxide 40 insulates the field plate 34 from the n− drift region 22. The field plate 34 is connected to the source electrode 12 outside the plane of FIG. 1.

When a gate-source voltage above the threshold is applied the gate 28, an inversion layer is formed along the trench in the p-well 20 to form a conductive channel between the n+ source region 16 and the n− drift region 22 to conduct a current between the source electrode 12 and the drain electrode 26.

It is desirable that the MOSFET 10 have low switching losses (low gate capacitance) for switching regular applications, a low on-resistance, and a high source-drain breakdown voltage. The split gate design reduces switching losses, reduces on-resistance, and improves the breakdown voltage.

The split-gate MOSFET 10 divides the polysilicon structure in the trench 30 into two electric potentials. The gate 28 is used for forming a channel in the p-well 20, and the field plate 34 is electrically coupled to the source potential, via a metal interconnect, for the generation of two-dimensional charge balance in the n− drift region 22 under current blocking conditions. The gate-to-source capacitance is reduced, compared to a traditional trench MOSFET, due to the field plate 34 and oxide 36, so as to reduce switching loss.

Ideally, for an optimized breakdown voltage, the n− drift region 22 is fully depleted just prior to the source-drain breakdown voltage. This is due to an optimized charge balance. This is more easily achieved using the split gate structure, where the fixed positive charges in the drift region 22 counterbalance the negative (electron) charges on the field plate 34.

The field plate 34 and substrate 24 (drain) form a capacitor which causes the electric field along the trench area to be more spread out to improve the breakdown voltage. The field plate 34 also lowers the gate-drain capacitance, for reduced switching losses, since the field plate 34 effectively shields the gate 28 from the drain potential. The oxide 40 around the field plate 34 must withstand the full drain potential since the field plate 34 is connected to the source potential.

The split gate technique allows the n− drift region 22 to be more highly doped to reduce on-resistance, or the n− drift region 22 can be made thinner.

The basic process flow for forming the conventional split gate MOSFET 10 is depicted in FIGS. 2-10.

FIG. 2 depicts the product of successive processes of thermal buffer oxide growth (typically 200 Ang), hard mask deposition (typically 4000-8000 Ang by LP-CVD), trench lithography, and silicon etching to form a U-shaped trench 30 in a lightly doped n− drift region 22 epitaxially grown over an n++ substrate 24.

FIG. 3 depicts a thick field oxide 40 thermally grown on the silicon mesa surface and along the trench 30 sidewall and trench bottom.

In FIG. 4, a doped field plate (FP) polysilicon is deposited to partly fill the trench 30 without any void or gap. After the deposition, the FP poly is etched back to a certain depth to form a conductive field plate 34, so that there is enough room within the trench 30 to later form an isolation field oxide layer and gate structure on top of the field plate 34.

In FIG. 5, the isolation field oxide 36 is deposited (typically by HDP-CVD) to fill the trench 30 without any void or gap. After deposition, the field oxide 36 is planarized and etched back by wet etching, RIE, and/or CMP (chemical-mechanical polishing) to a certain depth so that the remaining field oxide 36 is thick enough to withstand the gate-to-source voltage. There should be enough room within the trench 30 to form a gate structure on top of the field oxide 36.

In FIG. 6, the thin gate oxide 32 is formed by thermal oxidation, deposition, or composite method. After this process, a thick gate polysilicon 42 is deposited to completely fill the trench 30 without any void or gap. A relatively thick polysilicon (typically 10k-Ang) is required to fill the trench and overlap the silicon surface.

In FIG. 7, the gate polysilicon 42 is removed from the silicon surface by CMP and recessed by blanket etching, so that it is slightly lower than the silicon mesa surface, to form the gate 28.

In FIG. 8, a field oxide layer 14 is formed over the gate 28 and silicon surface. Boron is then implanted and driven-in to form the p-well 20. Phosphorus is then implanted and driven-in to form the n+ source region 16 within the p-well 20.

In FIG. 9, contact lithography and etching are used to etch the field oxide layer 14 from portions of the surface.

In FIG. 10, which is identical to FIG. 1, p+ contact regions 18 are formed in the p-well 20 by implantation and drive-in of boron. The silicon is recessed, and a metal source electrode 12 is formed. The source electrode 12 contacts the field plate 34 poly outside the plane of the cross-section. The back surface of the substrate 24 is ground down, and backside metallization is used to form the drain electrode 26.

As seen in the steps of FIGS. 6 and 7, a relatively thick gate polysilicon 42 (typically ~10000 Ang) is required, which significantly decreases the fab's (wafer fabrication facility) throughput and increases manufacture cost. Furthermore, to planarize the gate poly surface, poly CMP is required, which is a laborious mechanical process. Poly CMP is expensive and is not available in most fabs.

What is desired is a process technique and split gate MOSFET structure that does not require the thick gate polysilicon 42 of the prior art and the expensive CMP step of FIGS. 6 and 7. In this way, throughput is increased, costs are reduced, and more types of fabs can fabricate the MOSFET. It is also desirable that gate capacitance be decreased for reduced switching losses.

SUMMARY

A split gate power semiconductor device, such as a MOSFET is disclosed having a trench with a top gate portion that, when biased above a threshold voltage, creates a conductive channel in a p-well. The semiconductor material can be for example silicon, silicon carbide, or other semiconductor material.

The split gate also comprises an underlying field plate in the trench, coupled to the source electrode, for spreading the electric field along the trench to improve the breakdown voltage. The MOSFET may be a part of any trenched power device, such as an IGBT.

The top gate is initially formed as a relatively thin, generally U-shaped layer of conductive material, such as polysilicon, so that it can be patterned using non-CMP or other planarization techniques, such as dry etching or wet etching. As such, the MOSFET fabrication does not require CMP or expensive planarization capability. Furthermore, the resulting MOSFET has performance improvements over non-split gate MOSFETs.

In one embodiment, the thin, U-shaped top gate has vertical and lateral portions that create conductive vertical and lateral channels in a p-well to reduce on-resistance.

In another embodiment, the thin top gate is not U-shaped and has only vertical portions along the trench sidewalls for minimizing surface area and gate capacitance.

BRIEF DESCRIPTION OF DRAWINGS

FIG. 11 shows an embodiment of the invention, where a relatively thin gate poly forms a generally U-shaped poly liner layer instead of completely filling the trench, enabling the thin gate poly to be patterned by non-CMP etching processes (wet or dry etching), widely available in fabs.

FIG. 12 is the same FIG. 4 and just taken as a starting point for a clear depiction of the subsequent process.

Elements that are the same or equivalent in the various figures are labeled with the same numeral.

DETAILED DESCRIPTION

In the present invention, relatively thin gate poly silicon (called gate poly) (typically ~4000 Ang) is used to form the gate, and the gate poly can be patterned with conventional photolithography and etching instead of poly CMP. There are improvements in performance, and the device can be less expensively formed, compared to the prior art, in fabs that do not have CMP capability. The resulting split gate MOSFET 46 is shown in FIG. 11.

Any process steps not specifically described can be the same as the prior art steps discussed above.

In FIG. 11, the relatively thin gate poly forms a generally U-shaped poly liner layer instead of completely filling the trench 30. The thin gate poly is then etched, using RIE or other conventional etching, to form the gate 48. This process, with thin gate poly deposition and without CMP, is helpful to significantly increase the fab's throughput and to reduce the cost. Furthermore, both vertical and lateral channels will be formed to enhance the device ruggedness.

Before gate polysilicon deposition, the process flow of this invention can be the same as the conventional flow, previously described.

The critical process flow of this invention is depicted in FIGS. 12-17.

Figure 2:
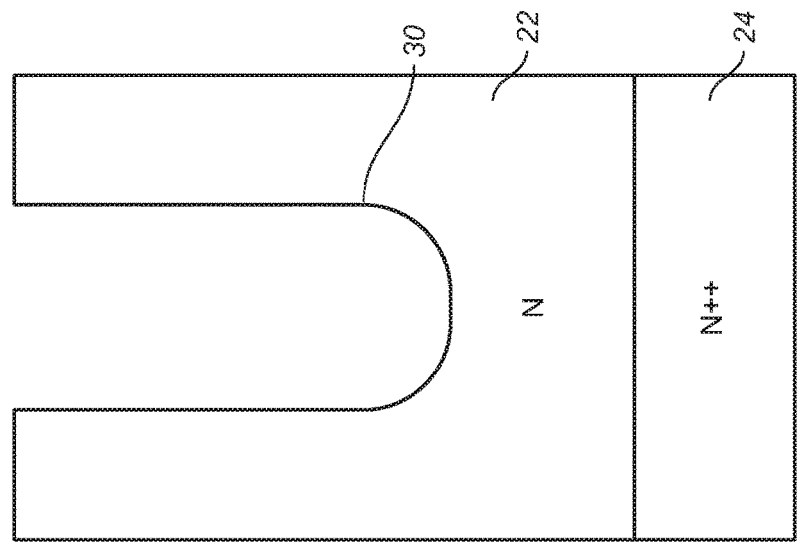
FIG. 2 depicts the product of successive processes of thermal buffer oxide growth, hard mask deposition, trench lithography, and silicon etching to form a U-shaped trench in a lightly doped n– drift region epitaxially grown over an n++ substrate.
Figure 1:
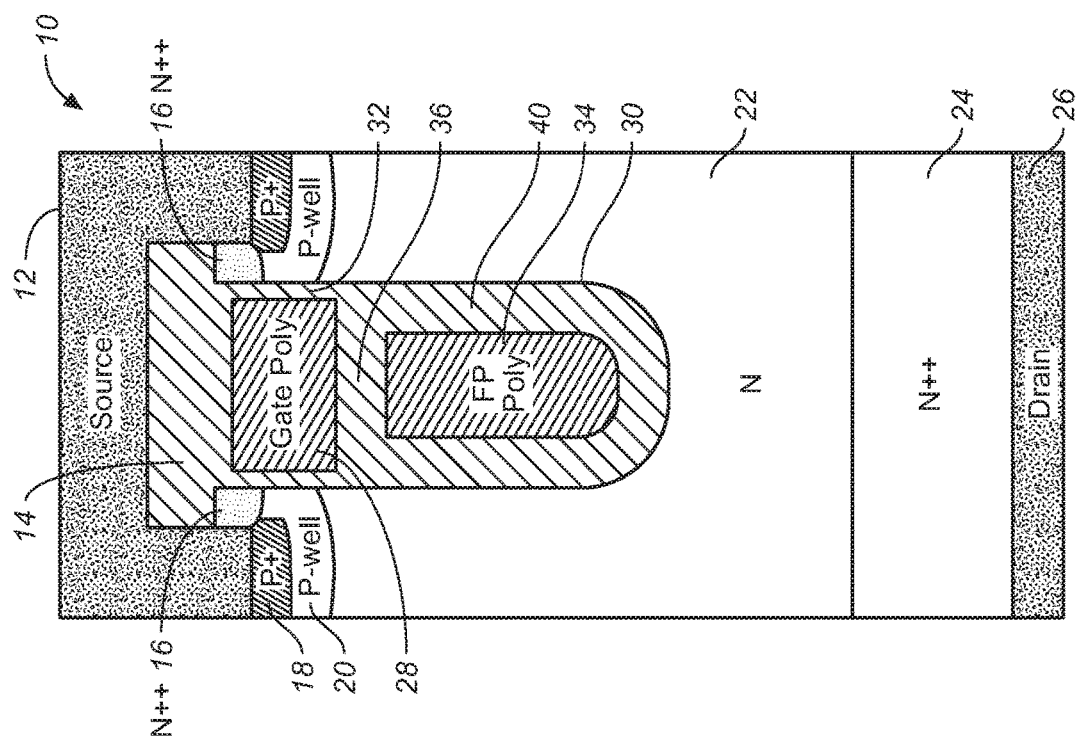
FIG. 1 is a cross-sectional view of a typical prior art split-gate MOSFET.
Figure 4:
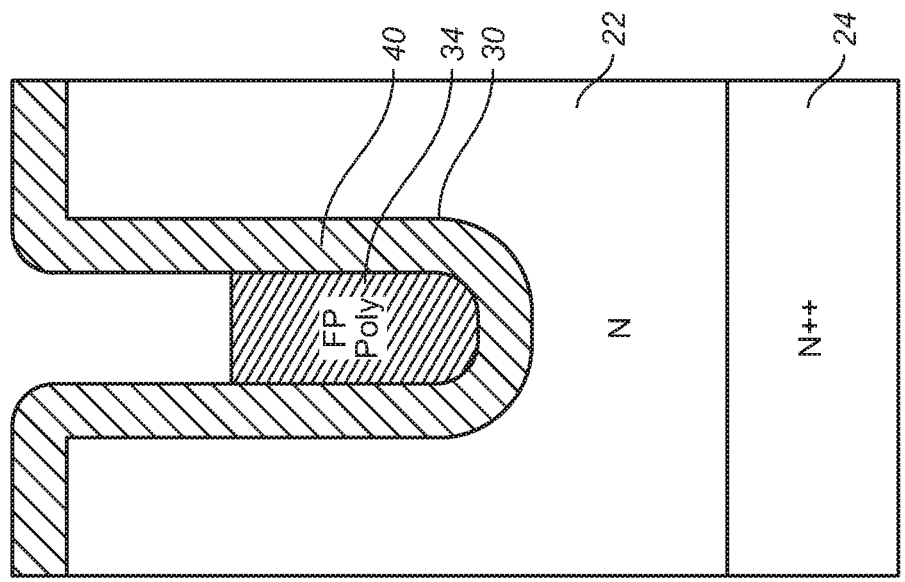
FIG. 4 shows a doped field plate (FP) polysilicon deposited and etched back to partly fill the trench.
Figure 3:
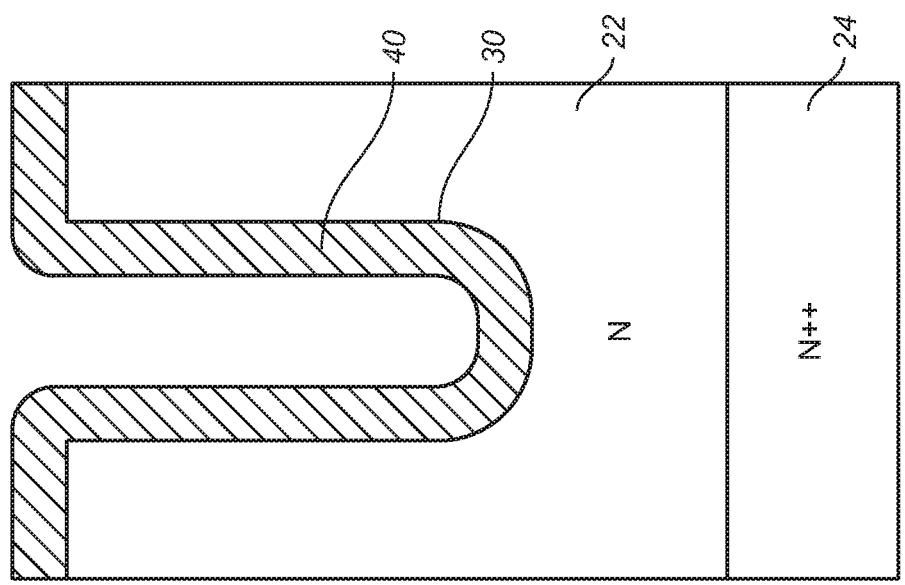
FIG. 3 shows a thick field oxide thermally grown on the silicon mesa surface and along the trench sidewall and trench bottom.

FIG. 12 is the same FIG. 4 and just taken as a starting point for a clear depiction.

Figure 6:
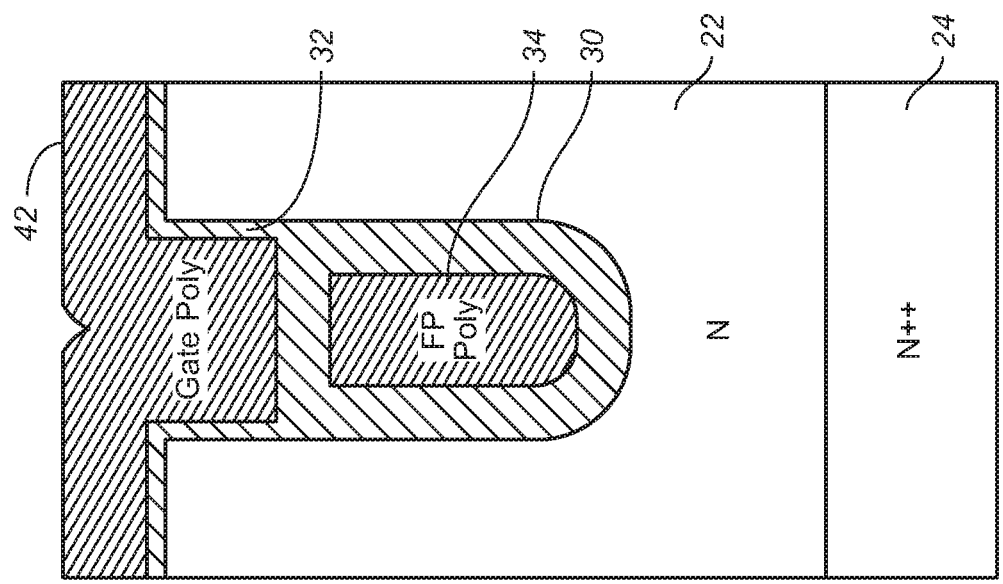
FIG. 6 shows a thin gate oxide formed by thermal oxidation, followed by a thick gate polysilicon deposited to completely fill the trench without any void or gap.
Figure 5:
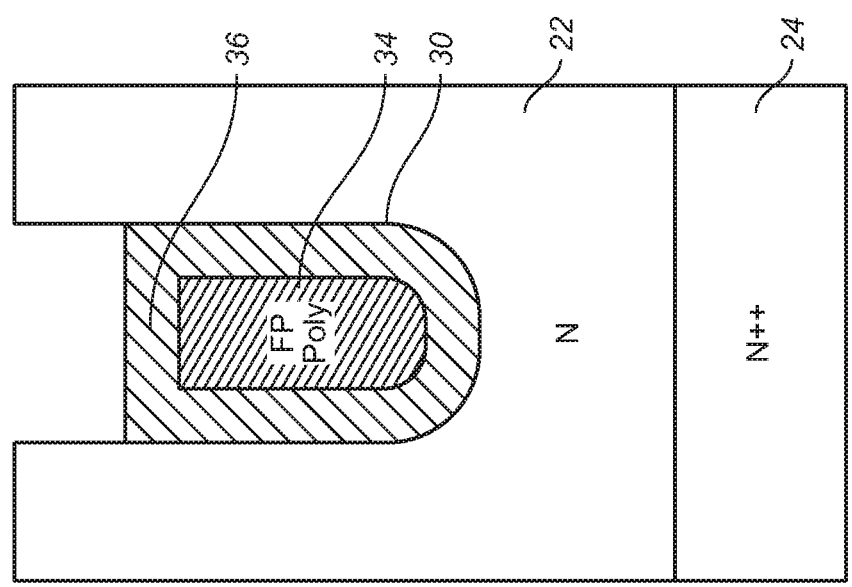
FIG. 5 shows isolation field oxide that is deposited to fill the trench and etched back by wet etching, RIE, or CMP (chemical-mechanical polishing) to a certain depth.
Figure 7:
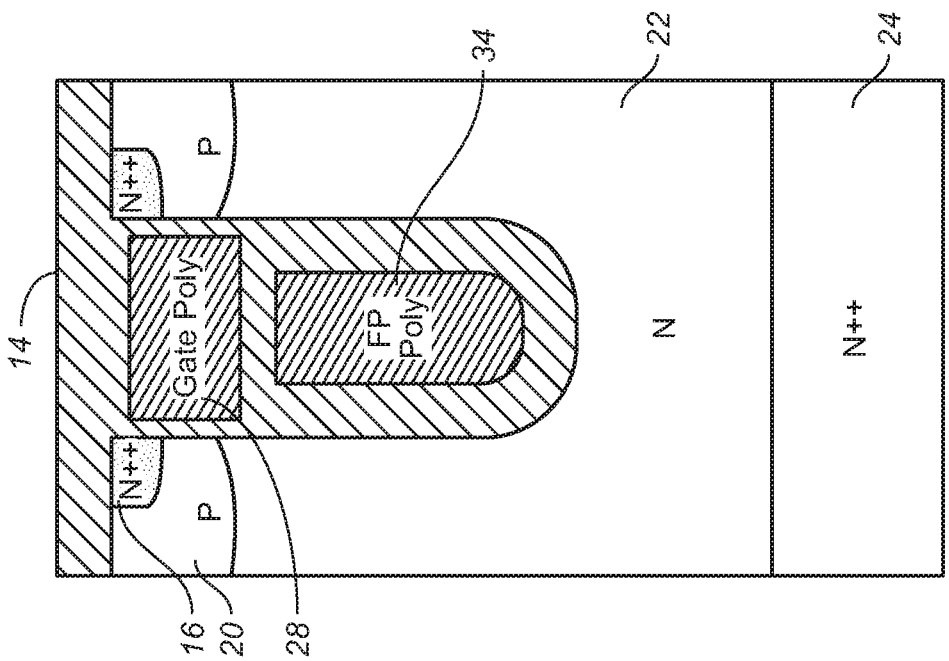
FIG. 7 shows the gate polysilicon being planarized by CMP, then recessed by blanket etching so that it is slightly lower than the silicon mesa surface, to form the gate.
Figure 8:
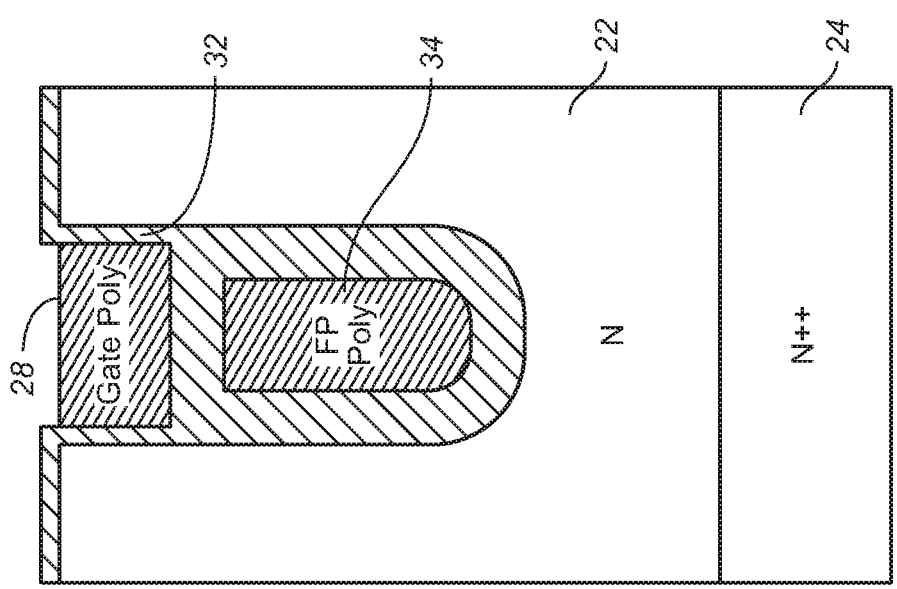
FIG. 8 shows a field oxide layer formed over the gate and silicon surface, where boron is then implanted and driven-in to form a p-well, and phosphorus is then implanted and driven-in to form the n+ source region within the p-well.
Figure 10:
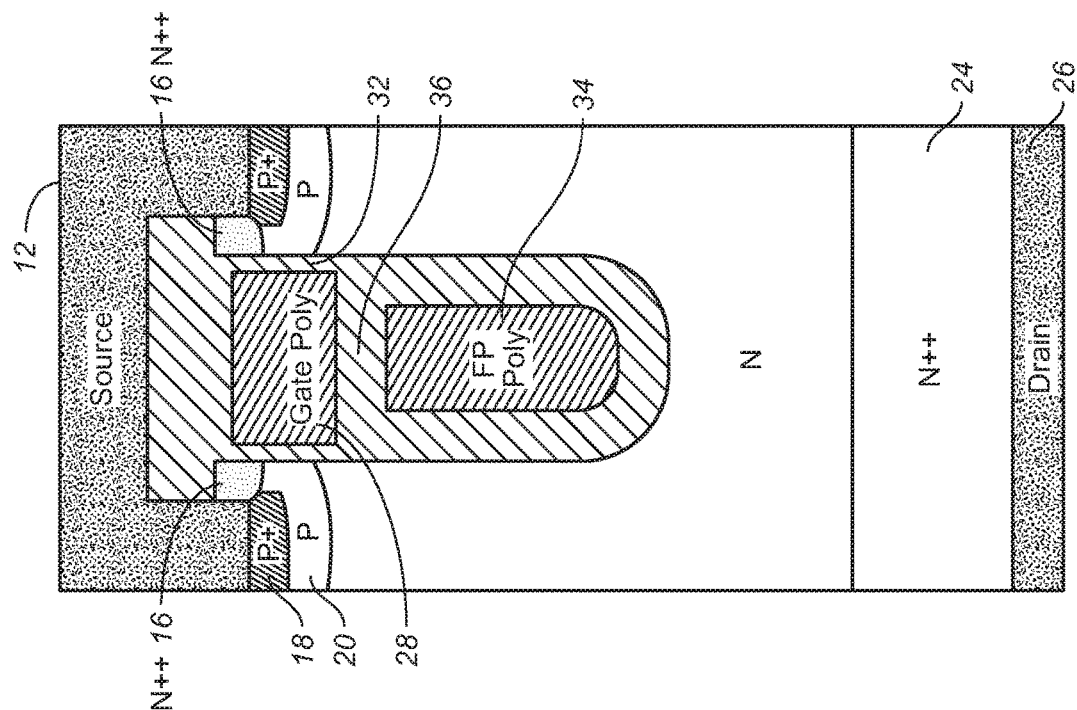
FIG. 10 is identical to FIG. 1 and is used to show the final steps for forming the prior art split gate MOSFET.
Figure 9:
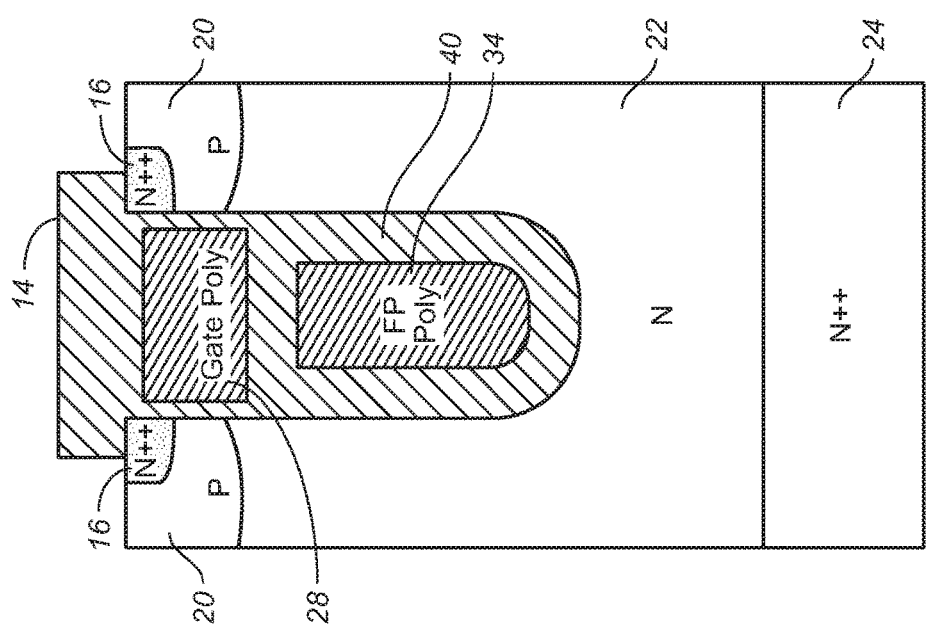
FIG. 9 shows the field oxide layer etched from portions of the surface.
Figure 13:
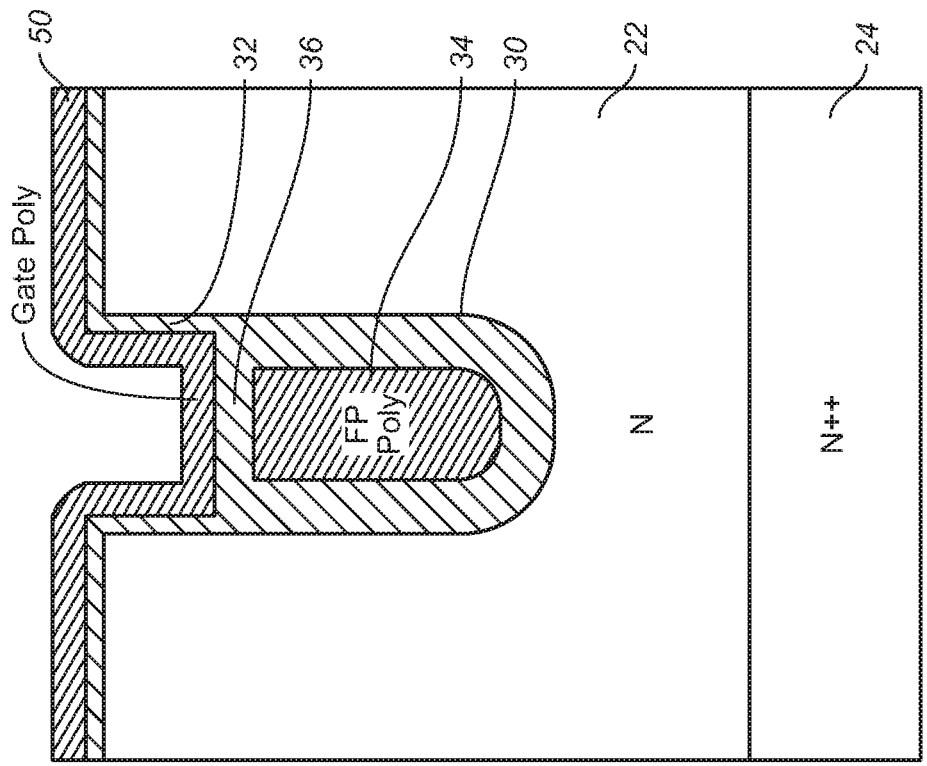
FIG. 13 shows the gate oxide formed over the trench sidewalls and top semiconductor surface, followed by depositing a relatively thin, generally U-shaped gate poly layer along the trench sidewalls and over the top semiconductor surface instead of completely filling the trench, in contrast to the prior art FIG. 6.

In FIG. 13, the thin gate oxide 32 is formed by a thermal oxidation, deposition, or composite method. A U-shaped recess in the trench 30 exists. After this process, a gate poly 50 is deposited. Relatively thin polysilicon (typically 4k-Ang) is required to form the gate poly 50 in the trench 30 instead of completely filling the trench, in contrast to the prior art FIG. 6.

Figure 14:
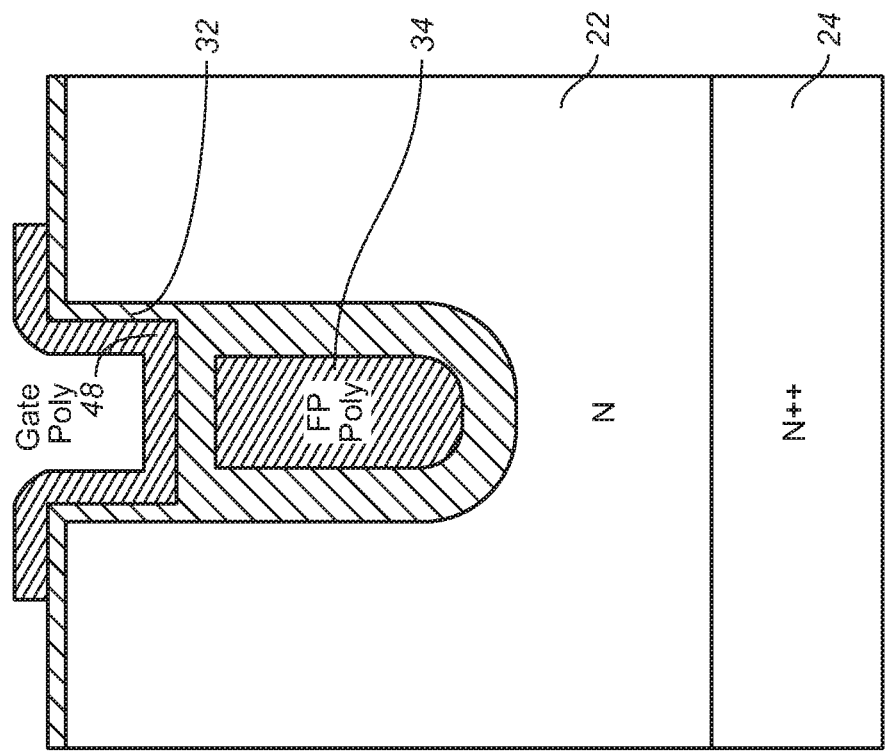
FIG. 14 shows the gate poly being patterned with conventional photolithography (e.g., patterned photoresist) and etching (e.g., Reactive Ion Etching (RIE), or a TMAH wet etch), instead of using the prior art poly CMP, to form the gate.

In FIG. 14, the gate poly is patterned with conventional photolithography (e.g., patterned photoresist) and etching (e.g., RIE, or a TMAH wet etch), instead of the prior art poly CMP, to form the generally U-shaped gate 48. This can be done in virtually any fab.

Figure 16:
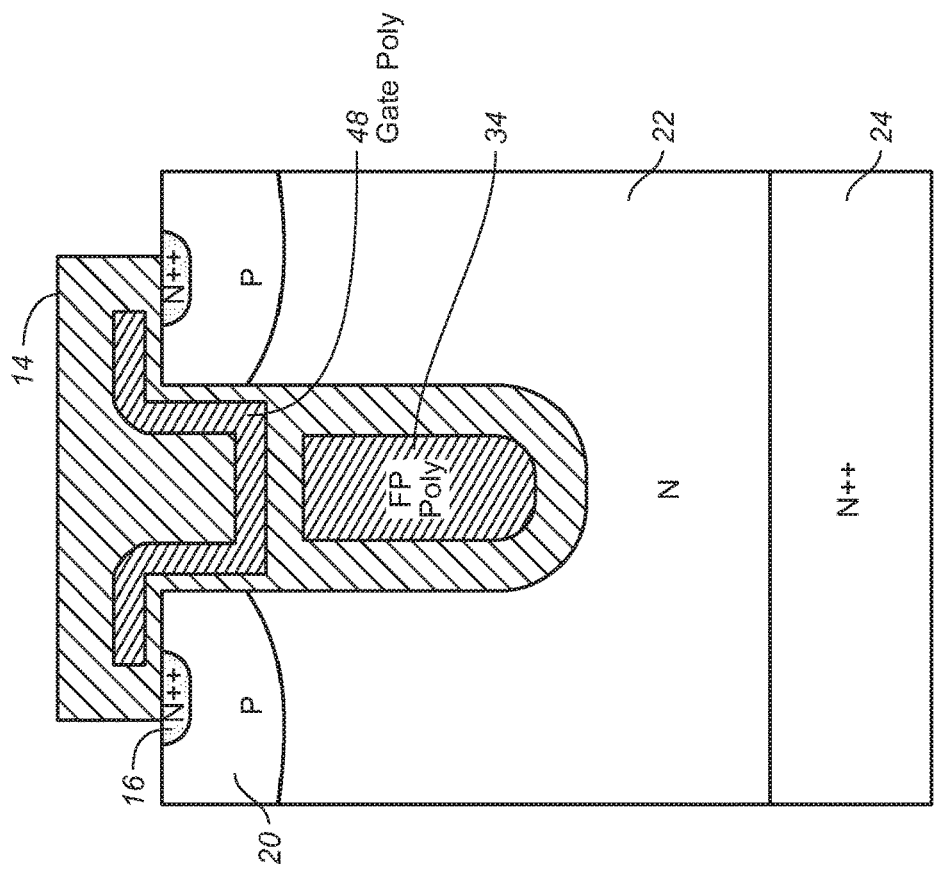
FIG. 16 shows the field oxide layer etched from portions of the semiconductor surface.
Figure 15:
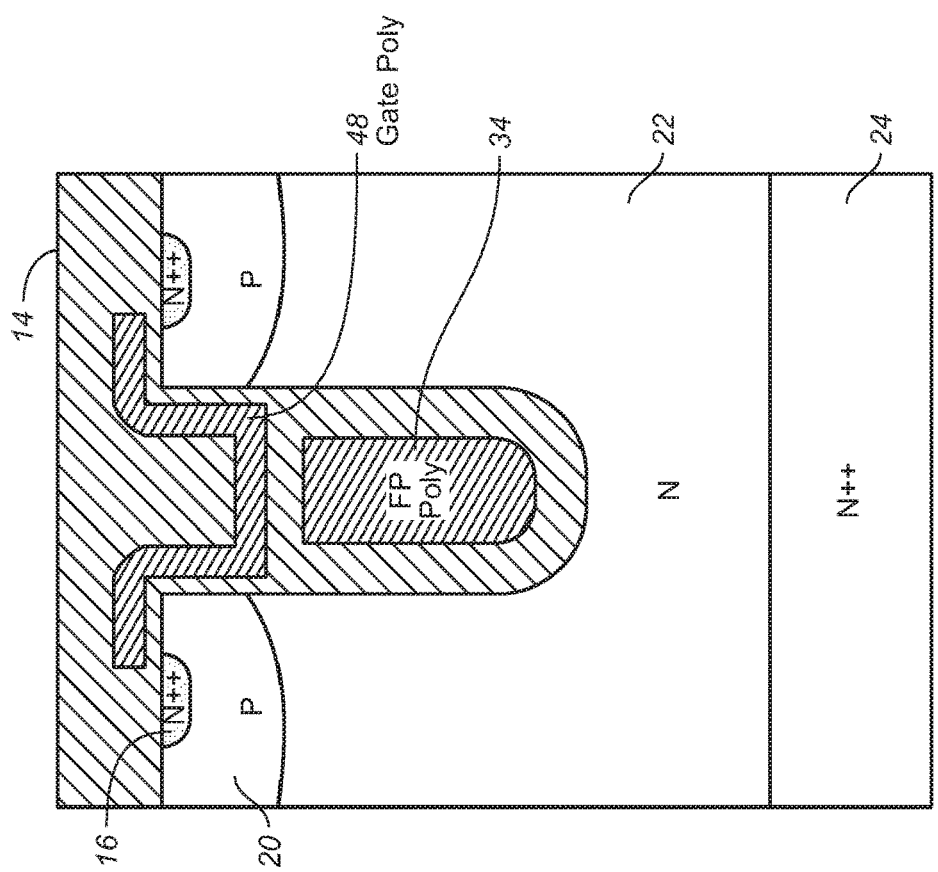
FIG. 15 shows a field oxide layer over the gate and silicon surface, followed by a boron implant and drive-in to form the p-well, followed by a self-aligned phosphorus implant and drive-in to form the n+ source region within the p-well.
Figure 17:
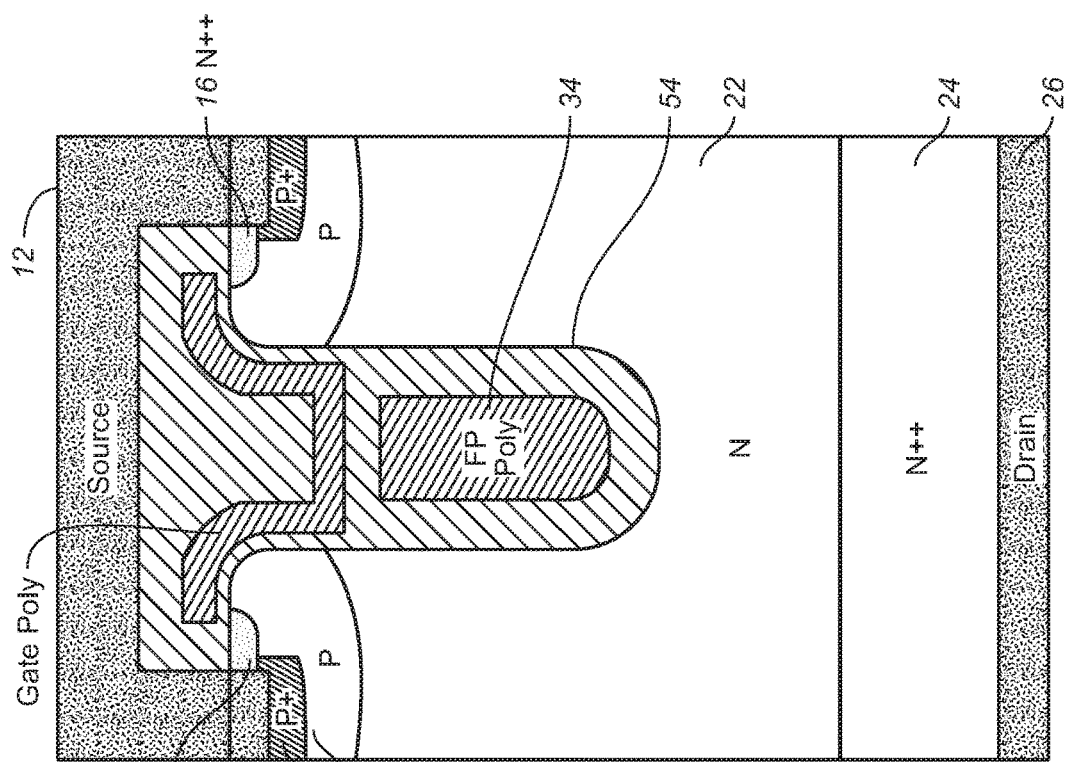
FIG. 17, which is identical to FIG. 11, shows the formation of p+ contact regions in the p-well, a metal source electrode, and a drain electrode. The gate forms lateral and vertical channels in the p-well.

Standard processes can be used for FIGS. 15-17.

In FIG. 15, a field oxide layer 14 is formed over the gate 48 and semiconductor surface. A p-type dopant, such as boron, is then implanted to form the p-well 20. An n-type dopant, such as phosphorus, is then implanted to form the n+ source region 16 within the p-well 20. The edges of the gate 48 self-align the implantation.

In FIG. 16, contact lithography and etching are used to etch the field oxide layer 14 from portions of the semiconductor surface.

In FIG. 17, which is identical to FIG. 11, p+ contact regions 18 are formed in the p-well 20, for example, by implantation and drive-in of boron. The semiconductor is recessed, and a metal source electrode 12 is formed. The source electrode 12 contacts the field plate 34 outside the plane of the cross-section. The back surface of the substrate 24 is ground down, and backside metallization is used to form the drain electrode 26.

Since the gate 48 is extended beyond the trench sidewall and overlies the semiconductor mesa surface, both conductive vertical and lateral channels can be formed in the p-well to enhance the device ruggedness and reduce-on-resistance. The conductive channels are formed when the gate 48 is biased at a positive voltage, relative to the source electrode 12, above a threshold voltage. More specifically, the vertical portion of the gate 48 creates a vertical channel through the p-well 20, which conducts a generally vertical current, and the top horizontal portion of the gate 48 creates a lateral channel, that conducts a generally lateral current, through the p-well 20. The two inversion layers merge, so there is very low on-resistance between the n+ source region 16 and the n− drift region 22. This also allows the p-well 20 to be more highly doped to improve the breakdown voltage.

Figure 18:
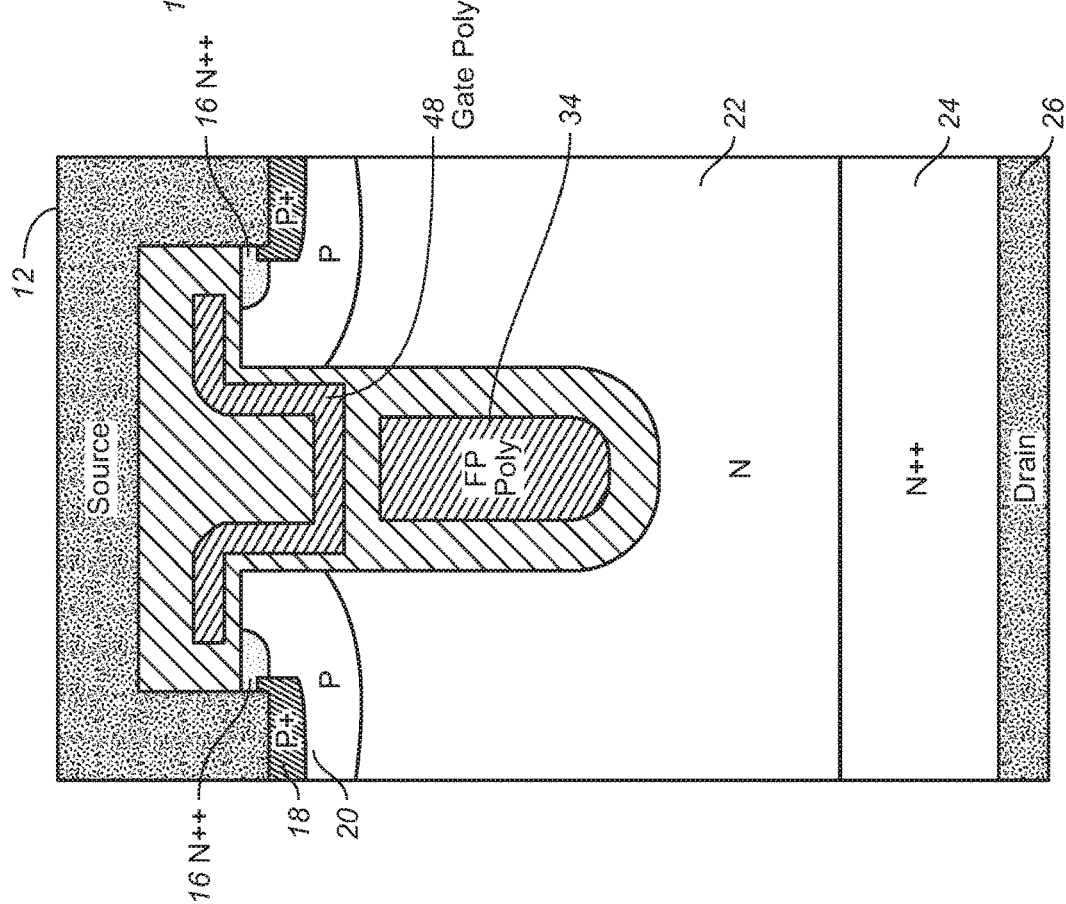
FIG. 18 shows an alternative split gate MOSFET, in which the trench top corners are rounded to enhance the gate-to-source ruggedness (reduces the electric field) at the corners.

FIG. 18 shows an alternative split gate MOSFET 52, in which the trench 54 top corners are rounded to enhance the gate-to-source ruggedness (reduces the electric field) at the corners.

Figure 19:
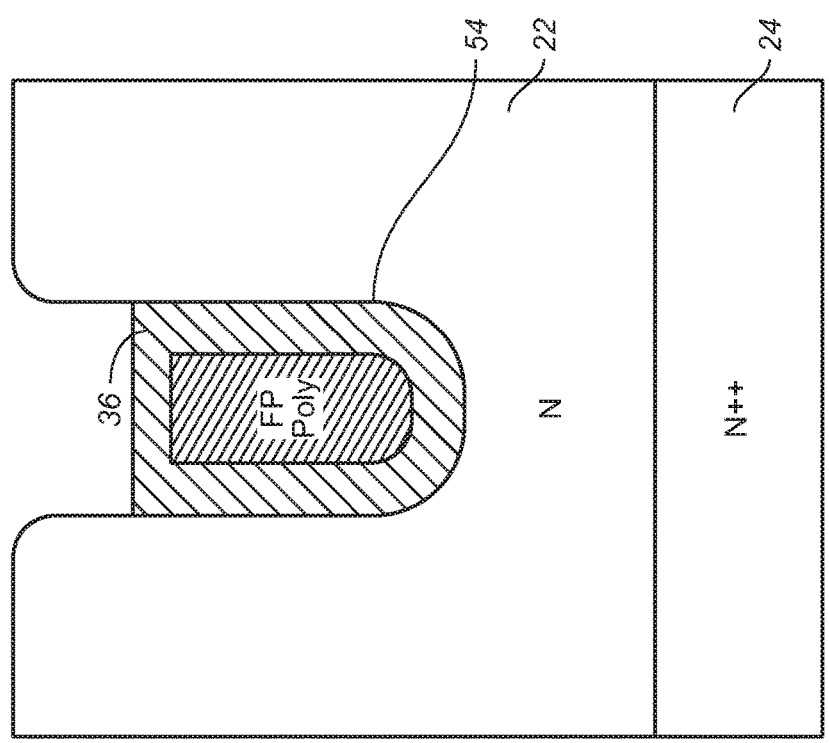
FIG. 19 depicts the process to form the rounded top corners of the trench.

FIG. 19 depicts the process to form the rounded top corners of the trench 54, where the trench top corners can be rounded during the oxide 36 etch-back using isotropic dry etching.

Figure 20:
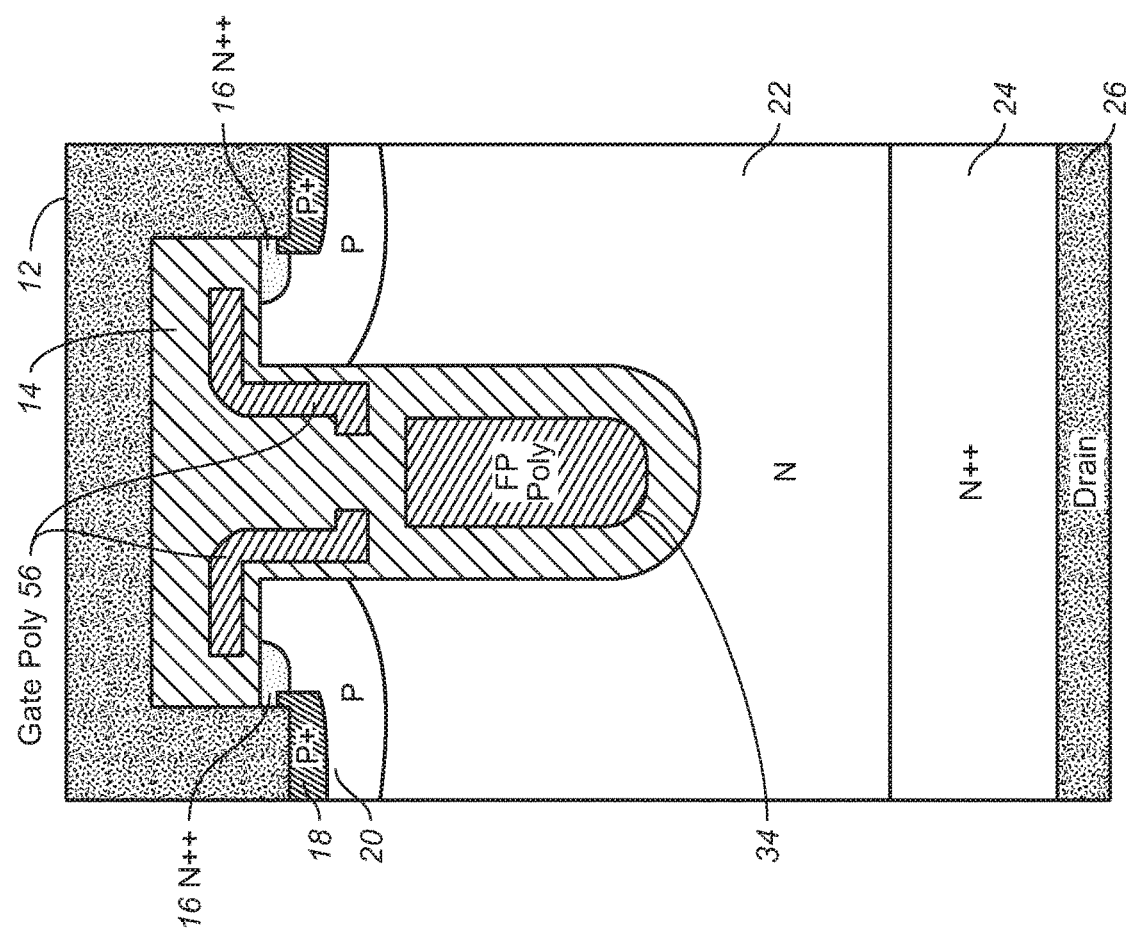
FIG. 20 shows an alternative structure of the invention, in which the gate poly directly overlying the field plate is partially removed so that the gate-to-source capacitance can be reduced.

FIG. 20 shows an alternative structure of the invention, in which the gate poly overlying the field plate 34 is partially removed so that the gate-to-source capacitance can be reduced. In this case, the gate 56 has two portions (interconnected outside the plane of the cross-section), where each portion inverts the p-well 20 vertically and laterally. The removal of the bottom portion of the gate 56 reduces the gate capacitance so improves switching performance.

Figure 21:
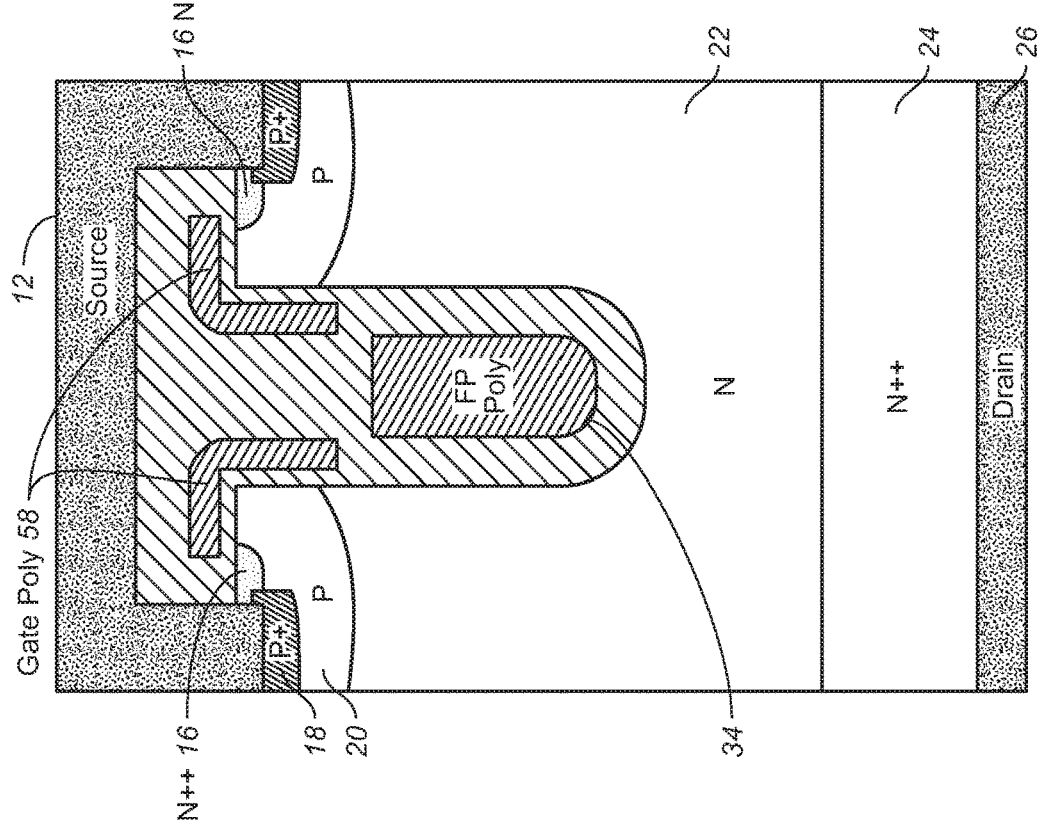
FIG. 21 is similar to FIG. 20 except that the bottom of the gate is completely removed for minimizing gate capacitance.

FIG. 21 is similar to FIG. 20 except that the bottom of the gate 58 is completely removed for minimizing gate capacitance.

Figure 22:
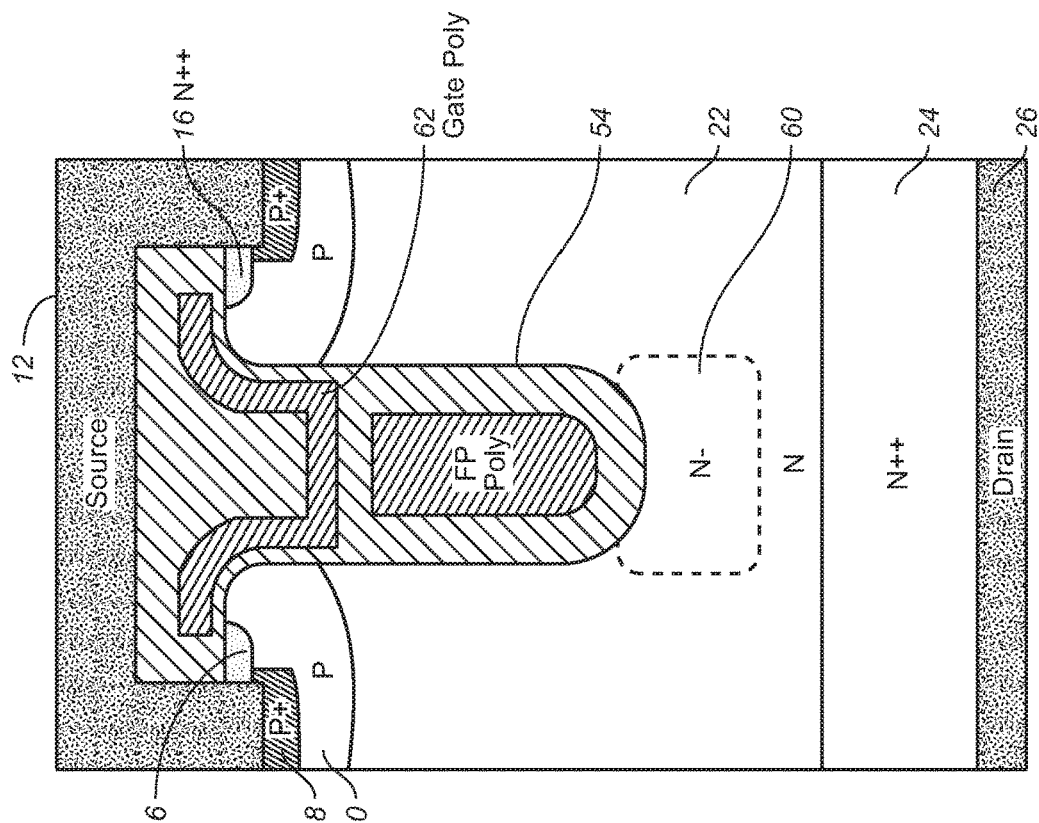
FIG. 22 shows an alternative structure of the invention, in which an n– region is formed below the trench to relax the crowding of electric field near the bottom of the trench so that the device ruggedness is improved.

FIG. 22 shows an alternative structure of the invention, in which an n− region 60 is formed below the trench 54 to relax the crowding of electric field near the bottom of the trench 54 so that the device ruggedness is improved. The net n-type dopant concentration of the n− region 60 is lower than that of the n− drift region 22. The n− region 60 may be formed by implanting, for example, boron into the trench 54 bottom just after trench etching to partially and locally compensate the n− drift region 22. In FIG. 22, the gate 62 has a rounded upper portion, due to the trench 54 having rounded top edges. This reduces field crowding to ease the dielectric requirements.

Figure 23:
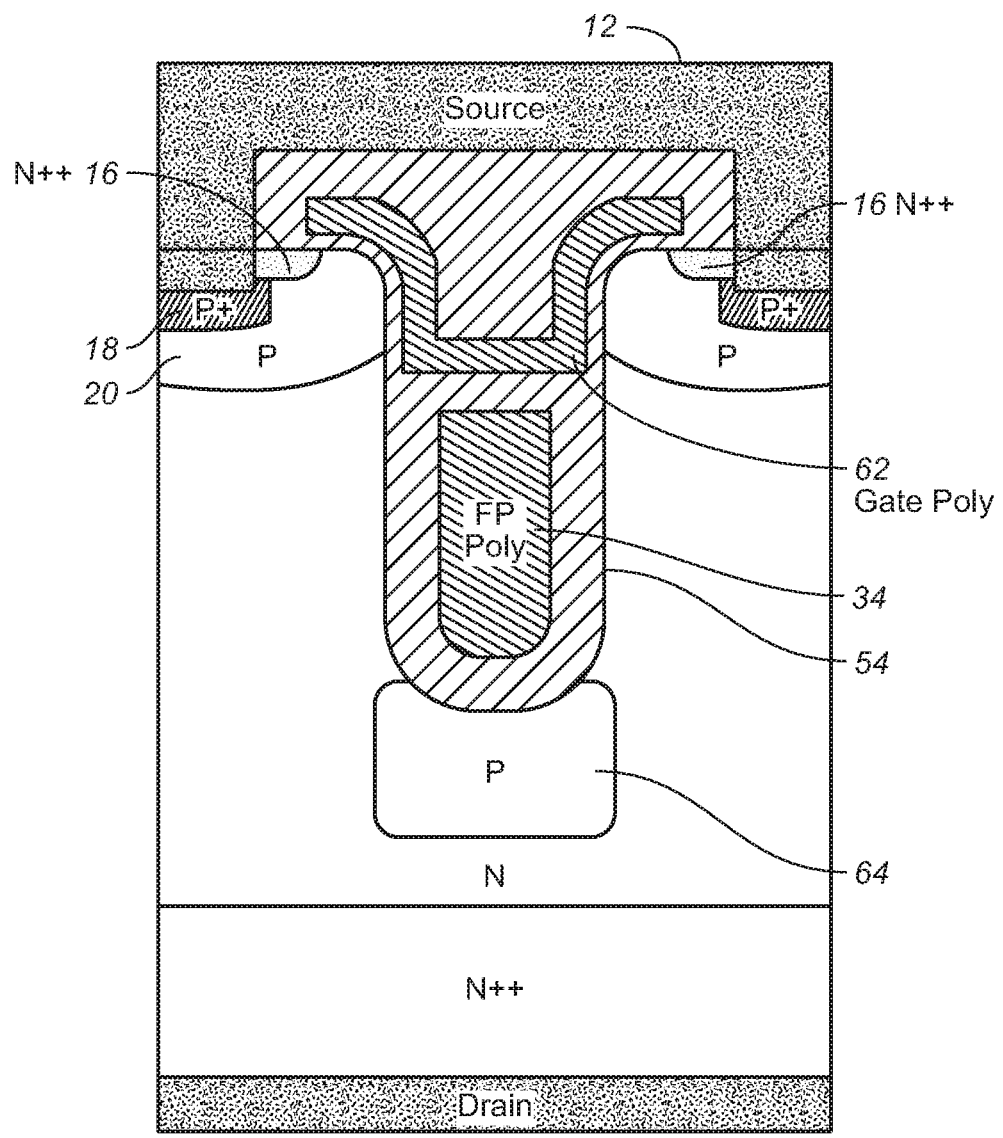
FIG. 23 shows an alternative structure of the invention, in which a p– region is formed below the trench.

FIG. 23 shows an alternative structure of the invention, in which a p− region 64 is formed below the trench 54. The p− region 64, along with the effect of the field plate 34, better enables the structure to achieve charge balancing for optimal breakdown voltage performance. The p− region 64 can be formed by implanting boron into the trench 54 bottom just after trench etching.

Optionally, the p− region 64 can be formed with a p-type buried process.

Figure 24:
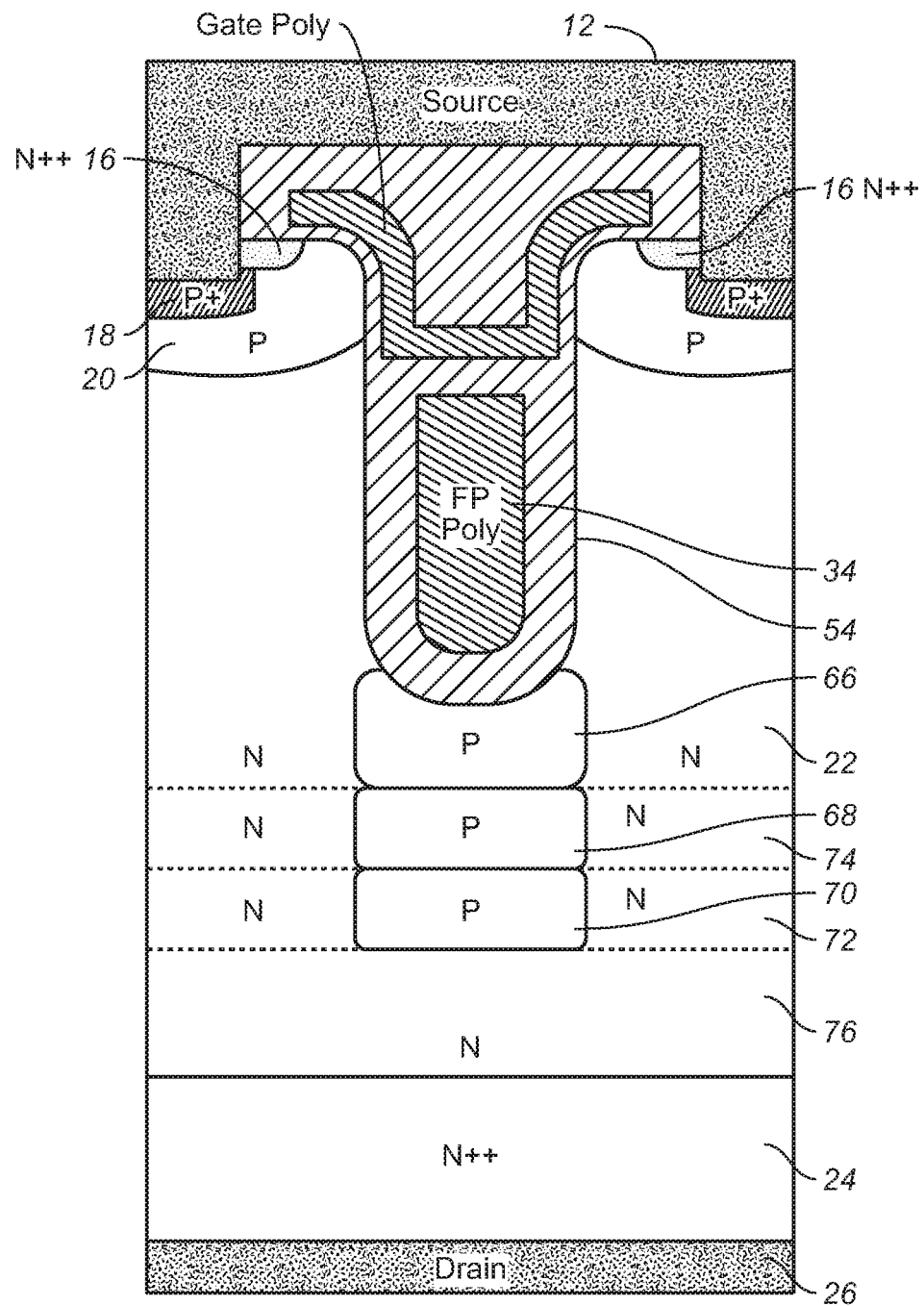
FIG. 24 shows an alternative structure of the invention, in which multiple p regions are formed below the trench to better achieve charge balancing, in combination with the effect of the field plate.

FIG. 24 shows an alternative structure of the invention, in which multiple p regions 66, 68, 70 are formed below the trench 54 to better achieve charge balancing, in combination with the effect of the field plate 34. The top p region 66 can be formed by implanting a dopant such as boron into the trench 54 bottom just after trench etching, while the other p regions 68 and 70 can be formed with a p-type buried process. Optionally, all p regions 66, 68, and 70 can be formed with a p-type buried process. The added n− drift regions 72 and 74 can be formed during the p-type buried process. The doping concentrations of the n− drift regions 22, 72, and 74 can be the same or different to get the optimal device performance. Optionally, there is a more highly doped n− buffer layer 76 between the deepest p region 70 and the n++ substrate 24.

All p regions 66, 68, and 70 can be vertically connected to each other or disconnected from each other.

Optionally, the p-region 70 can be extended into the n++ substrate 24.

The multiple n and p regions can be more than two or more regions.

Figure 25:
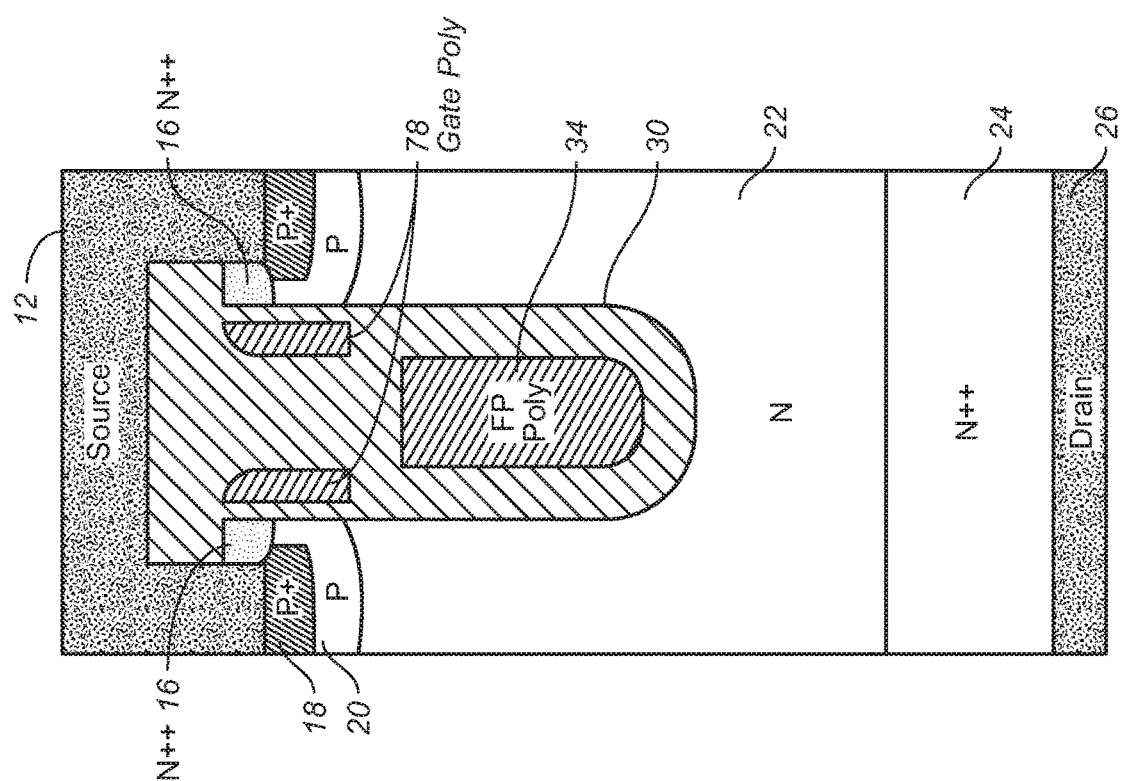
FIG. 25 shows an alternative structure with only a vertical poly gate.

FIG. 25 shows an alternative structure with only a vertical poly gate 78. The gate 78 is formed using un-masked (blanket) etching (after the step of FIG. 13), during which the lateral parts of the gate poly on the mesa and within the trench 30 are both completely removed in a self-aligned manner. Only a vertical channel will be formed in the p-well 20 along the sidewall of the trench 30. The n+ source 16 must then abut the trench sidewall. Without a lateral channel, the cell pitch can be reduced. The gate-to-source capacitance is greatly reduced in this design. The field plate 34 lies below the poly gate 78.

Before gate polysilicon patterning, the process flow of this alternative invention can be the same as in FIGS. 2-5, 12, and 13. For simplicity these processes will not be re-depicted.

An example of the process flow of this alternative invention is depicted in FIGS. 26 to 31.

Figure 26:
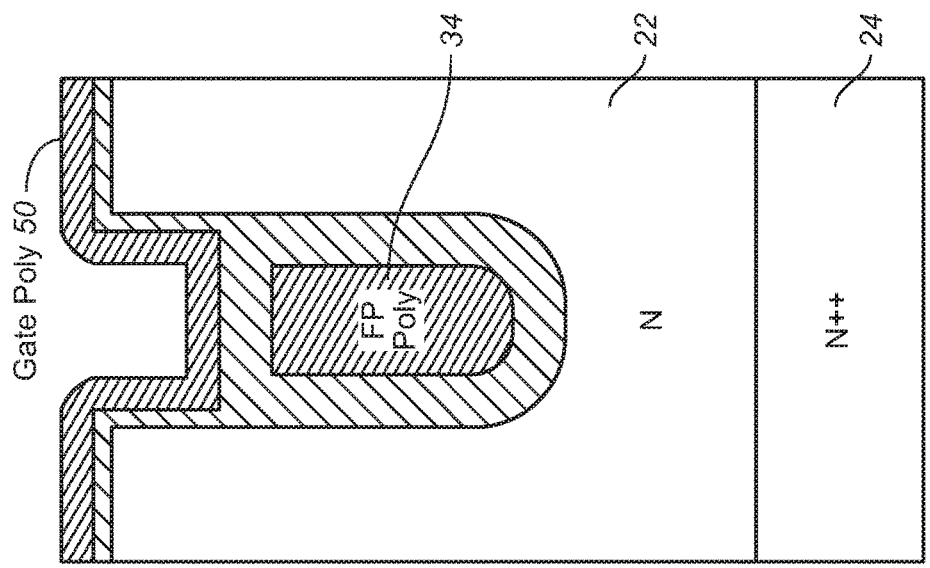
FIG. 26 is the same FIG. 13, and is used as a starting point for a clear depiction of the subsequent process steps.

FIG. 26 is the same FIG. 13, and is used as a starting point for a clear depiction.

Figure 27:
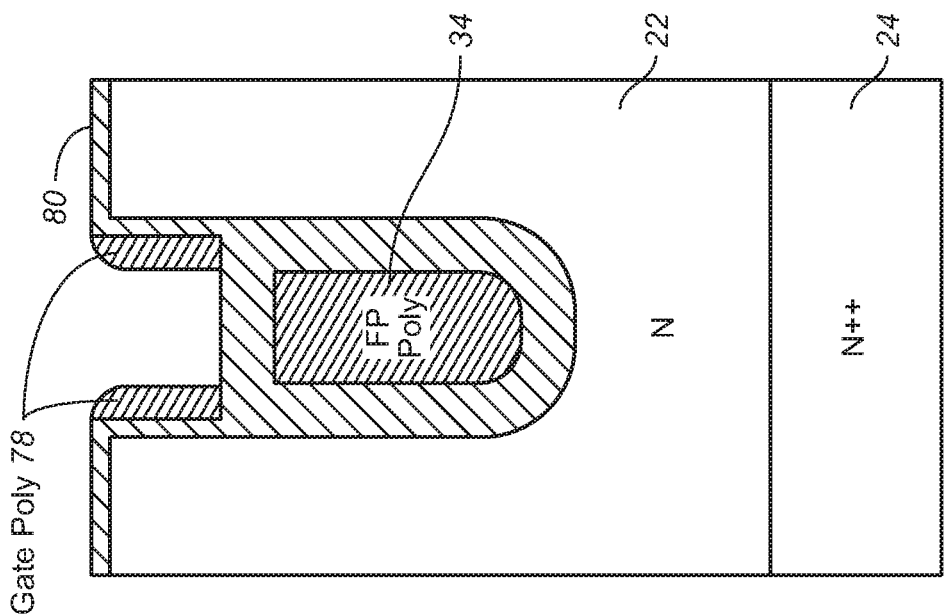
FIG. 27 shows the lateral portions of the gate poly removed using un-masked (blanket) etching to form the vertical gates.

In FIG. 27, the lateral portions of the gate poly 50 (FIG. 26) are removed using a non-masked (blanket) etching to form the vertical gates 78. The gate oxide 80 on the semiconductor mesa can be taken as the stop point for etching.

Figure 28:
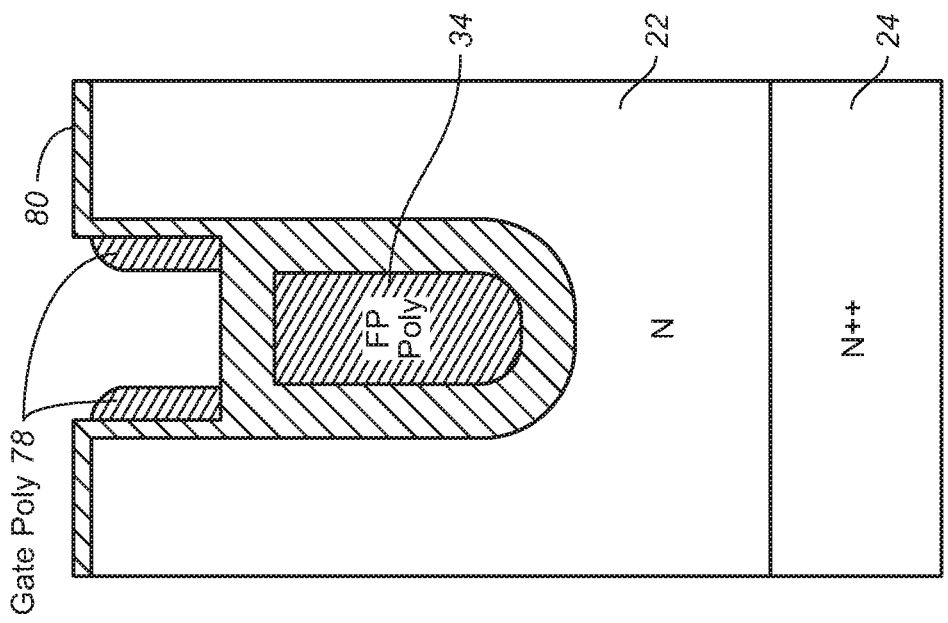
FIG. 28 shows the gate poly further recessed to remove possible poly residuals.

In FIG. 28, the gate poly is further recessed to remove possible poly residuals. Ultimately, the top surface of the gate 78 is slightly below the semiconductor mesa surface.

Figure 29:
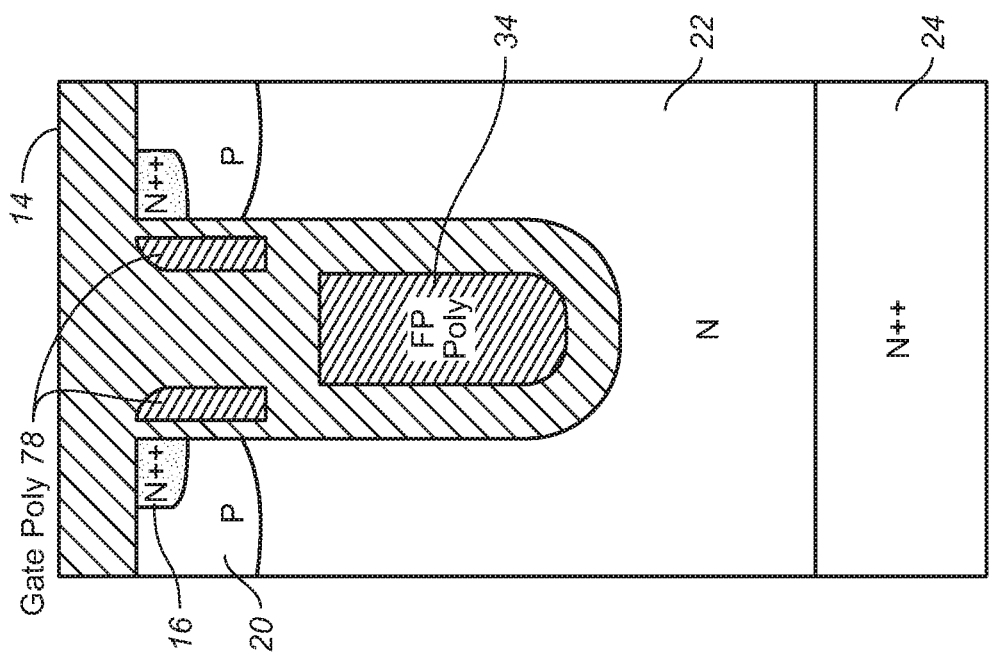
FIG. 29 shows a field oxide layer formed over the gate and semiconductor surface, followed by a boron implant and drive-in to form the p-well, followed by a phosphorus implant and driven-in to form the n+ source region within the p-well.
Figure 30:
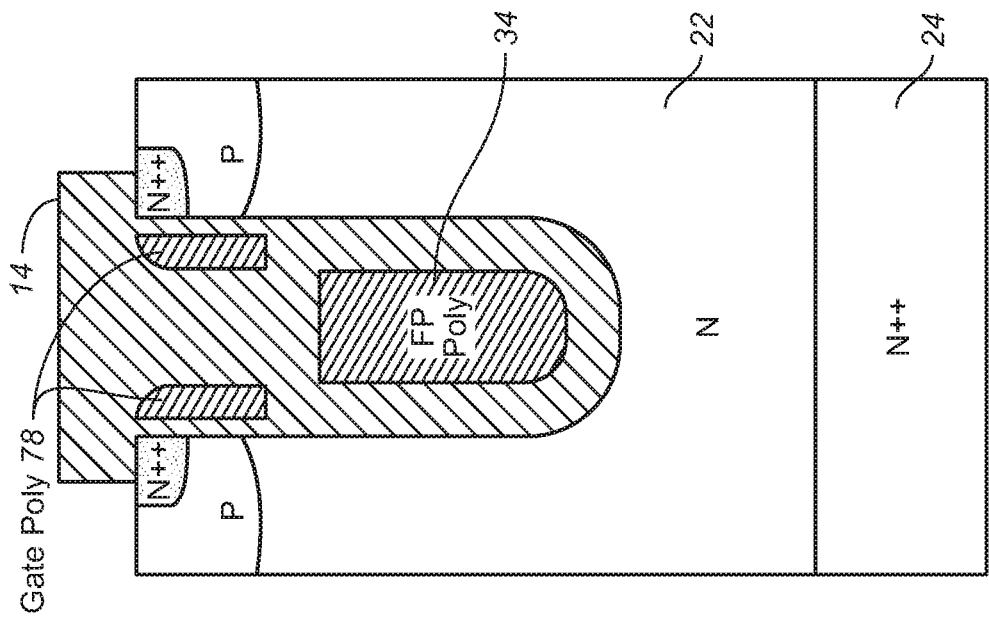
FIG. 30 shows the field oxide layer etched from portions of the semiconductor surface.
Figure 31:
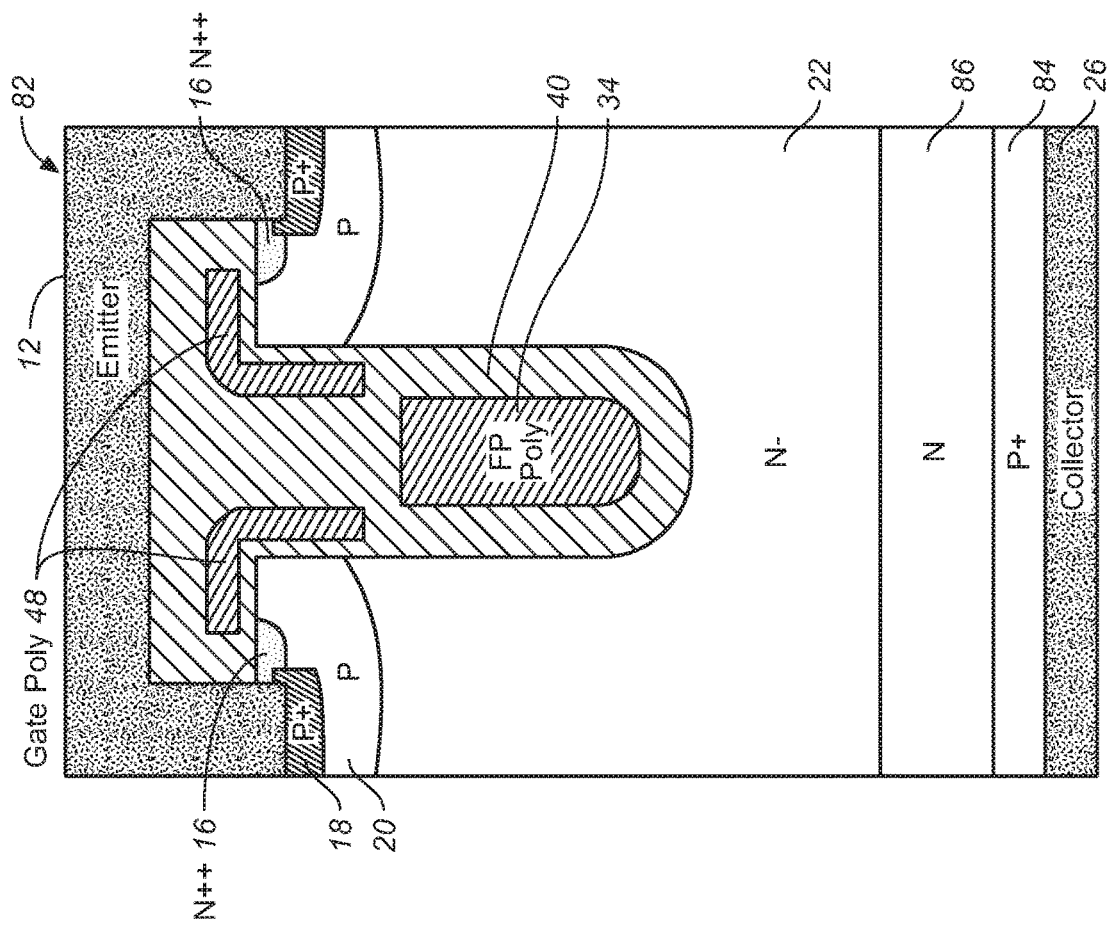
FIG. 31, which is identical to FIG. 25, shows p+ contact regions formed in the p-well, a metal source electrode, and a drain electrode.

Standard processes can be used for FIGS. 29-31.

In FIG. 29, a field oxide layer 14 is formed over the gate 78 and semiconductor surface. Boron is then implanted and driven-in to form the p-well 20. Phosphorus is then implanted and driven-in to form the n+ source region 16 within the p-well 20.

In FIG. 30, contact lithography and etching are used to etch the field oxide layer 14 from portions of the semiconductor surface.

It should be noted that the previous process steps can be performed in any order.

In FIG. 31, which is identical to FIG. 25, p+ contact regions 18 are formed in the p-well 20 by implantation and drive-in of boron. The semiconductor is recessed, and a metal source electrode 12 is formed. The source electrode 12 contacts the field plate 40 outside the plane of the cross-section. The back surface of the substrate 24 is ground down, and backside metallization is used to form the drain electrode 26.

Since there is no lateral gate poly on the semiconductor mesa, only a vertical channel can be formed. Furthermore, the lateral part of the gate poly within the trench is etched away automatically, so the gate-to-source capacitance is reduced to a minimum.

The present inventive technique can also be used for any trenched gate device, such as an IGBT and other devices. In an IGBT, a MOSFET portion of the IGBT is used to initiate regenerative action to turn on vertical npn and pnp transistors.

Figure 32:
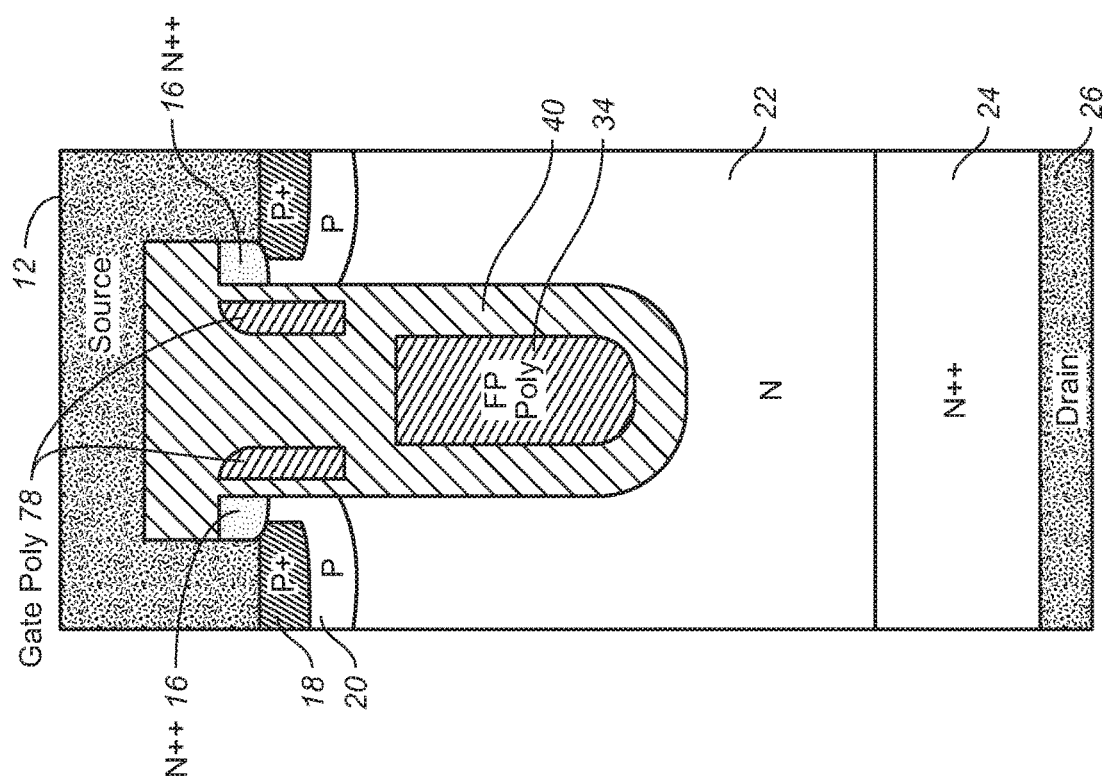
FIG. 32 illustrates an IGBT using the split gate MOSFET.

FIG. 32 illustrates an IGBT 82 using the split gate MOSFET design of FIG. 11 but any of the MOSFET designs disclosed herein may be used instead. In FIG. 32, the substrate 84 is p-type to form vertical npn and pnp bipolar transistors in a trench-gated device. The p+ substrate 84 then acts as a collector for the pnp transistor. The source electrode 12 may also be referred to as an emitter for the npn transistor, and the drain electrode 26 may also be referred to as a collector electrode. An n buffer layer 86 is added, which has a dopant concentration higher than that of the n− drift region 22.

The proportions in all the figures are depicted for simplicity, and the layer thicknesses and region sizes will vary from those shown in the above figures. Optimal thicknesses, sizes, and doping concentrations can be determined by simulation.

Any of the disclosed features can be combined in any combination in a MOSFET, IGBT, or other trench-gated device to achieve the particular benefits of that feature for a particular application.

The conductivities of all layers/regions can be made opposite to form a p-channel MOSFET rather than an n-channel MOSFET.

Although silicon is assumed in the examples, the semiconductor material can instead be silicon carbide, silicon germanium, or other similar materials.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A trenched power device including a split gate MOSFET comprising:
    a semiconductor substrate having a first electrode on its bottom surface;
    a drift region of a first conductivity type overlying the substrate;
    a well region of a second conductivity type within the drift region;
    a source region of the first conductivity type within the well region;
    a trench having a vertical sidewall along the well region, the trench terminating in the drift region;
    a conductive gate within the trench at least along the well region and insulated from the well region, wherein a portion of the well region abutting the trench is a channel region that is inverted by the gate, and conducts current, when a gate bias is above a threshold voltage;
    wherein the gate forms a generally U-shape having a lateral top portion that laterally extends over the well region between the source region and the trench, and having a vertical portion that vertically extends between the source region and the drift region;
    a conductive field plate within the trench below and insulated from the gate; and
    a second electrode electrically contacting the source region and the well region wherein, when a voltage is applied between the first electrode and the second electrode and the gate is biased above the threshold voltage, a generally lateral current flows across a top section of the well region, below the lateral top portion of the gate, and a generally vertical current flows next to the vertical portion of the gate.

2. The device of claim 1 wherein the field plate is connected to the second electrode.

3. The device of claim 1 wherein a bottom portion of the gate extends between vertical portions of the gate.

4. The device of claim 1 wherein the gate has an open area directly above the field plate.

5. The device of claim 1 wherein a transition part of the gate between the lateral top portion and the vertical portion is rounded.

6. The device of claim 1 further comprising a first region of the first conductivity type abutting a bottom of the trench, wherein the first region has a net dopant concentration that is less than a dopant concentration of the drift region.

7. The device of claim 1 further comprising a first region of the second conductivity type abutting a bottom of the trench.

8. The device of claim 1 wherein the first conductivity type is n-type.

9. The device of claim 1 wherein the first conductivity type is p-type.

10. The device of claim 1 wherein the substrate is of the first conductivity type.

11. The device of claim 1 wherein the substrate is of the second conductivity type.

12. A trenched power device including a split gate MOSFET comprising:
   a semiconductor substrate having a first electrode on its bottom surface;
   a drift region of a first conductivity type overlying the substrate;
   a well region of a second conductivity type within the drift region;
   a source region of the first conductivity type within the well region;
   a trench having a vertical sidewall along the well region, the trench terminating in the drift region;
   a conductive gate within the trench at least along the well region and insulated from the well region, wherein a portion of the well region abutting the trench is a channel region that is inverted by the gate, and conducts current, when a gate bias is above a threshold voltage;
   wherein the gate forms opposing vertical portions along sidewalls of the trench that vertically extend between the source region and the drift region;
   a conductive field plate within the trench below and insulated from the gate, wherein there is a gap between the opposing vertical portions directly above the field plate, so that the gate is not directly above at least a center of the field plate, wherein no portion of the field plate is between the vertical portions of the gate; and
   a second electrode electrically contacting the source region and the well region wherein, when a voltage is applied between the first electrode and the second electrode and the gate is biased above the threshold voltage, a generally vertical current flows next to the vertical portions of the gate.

13. The device of claim 12 wherein the gate has no lateral portions extending over the well region.

14. The device of claim 13 wherein the field plate is connected to the second electrode.

15. The device of claim 13 wherein the first conductivity type is n-type.

16. The device of claim 13 wherein the first conductivity type is p-type.

17. The device of claim 13 wherein the substrate is of the first conductivity type.

18. The device of claim 13 wherein the substrate is of the second conductivity type.

19. A method for forming a trenched power device including a split gate MOSFET comprising:
   providing a semiconductor substrate having a first electrode on its bottom surface;
   forming a drift region of a first conductivity type overlying the substrate;
   forming a well region of a second conductivity type within the drift region;
   forming a source region of the first conductivity type within the well region;
   forming a trench having a vertical sidewall along the well region, the trench terminating in the drift region;
   forming a generally U-shaped conductive gate within the trench at least along the well region and insulated from the well region, and patterning the gate using an etching technique other than CMP, wherein a portion of the well region abutting the trench is a channel region that is inverted by the gate, and conducts current, when a gate bias is above a threshold voltage;
   wherein the gate forms at least opposing vertical portions along sidewalls of the trench that vertically extend between the source region and the drift region;
   forming a conductive field plate within the trench below and insulated from the gate, wherein the gate has an open area directly above the field plate; and
   forming a second electrode electrically contacting the source region and the well region wherein, when a voltage is applied between the first electrode and the second electrode and the gate is biased above the threshold voltage, a generally vertical current flows next to the vertical portions of the gate,
   wherein forming the gate comprises forming the gate having a lateral top portion that laterally extends over the well region between the source region and the trench, and having the vertical portions that vertically extend between the source region and the drift region wherein, when a voltage is applied between the first electrode and the second electrode and the gate is biased above the threshold voltage, a generally lateral current flows across a top section of the well region, below the lateral top portion of the gate, and a generally vertical current flows next to the vertical portions of the gate.

* * * * *